US 9,147,758 B2

(12) United States Patent
Senoo

(10) Patent No.: US 9,147,758 B2
(45) Date of Patent: Sep. 29, 2015

(54) SEMICONDUCTOR DEVICE

(71) Applicant: Toyota Jidosha Kabushiki Kaisha, Toyota-shi Aichi-ken (JP)

(72) Inventor: Masaru Senoo, Okazaki (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 0 days.

(21) Appl. No.: 14/570,610

(22) Filed: Dec. 15, 2014

(65) Prior Publication Data

US 2015/0171199 A1    Jun. 18, 2015

(30) Foreign Application Priority Data

Dec. 17, 2013   (JP) ................................ 2013-260272

(51) Int. Cl.
| H01L 27/06 | (2006.01) |
| H01L 29/739 | (2006.01) |
| H01L 29/06 | (2006.01) |

(52) U.S. Cl.
CPC ........ H01L 29/7395 (2013.01); H01L 29/0696 (2013.01); H01L 29/7391 (2013.01)

(58) Field of Classification Search
CPC ... H01L 27/06; H01L 21/761; H01L 27/0727; H01L 29/861; H01L 29/7397; H01L 29/32; H01L 21/263; H01L 21/266; H01L 27/0664; H01L 21/22; H01L 21/268; H01L 29/8611
USPC ................. 257/140, 656, E27.09, E21.135, 257/E21.328, E21.347, E21.382, E29.109, 257/E29.066
See application file for complete search history.

(56) References Cited

U.S. PATENT DOCUMENTS

| 5,859,446 A | 1/1999 | Nagasu et al. |
| 2012/0007142 A1* | 1/2012 | Nagaoka et al. ............. 257/140 |
| 2012/0132954 A1 | 5/2012 | Kouno et al. |

FOREIGN PATENT DOCUMENTS

| JP | 09-232597 A | 9/1997 |
| JP | 2012-129504 A | 7/2012 |
| JP | 2013-102111 A | 5/2013 |
| JP | 2013-138069 A | 7/2013 |

* cited by examiner

*Primary Examiner* — Selim Ahmed
(74) *Attorney, Agent, or Firm* — Gifford, Krass, Sprinkle, Anderson & Citkowski, P.C.

(57) ABSTRACT

A semiconductor device includes a front surface electrode, a back surface electrode and a semiconductor substrate in which an IGBT and a diode are formed. An outer peripheral back surface p-type region, an outer peripheral back surface n-type region, and an outer peripheral low concentration n-type region are formed in an outer peripheral region. The outer peripheral back surface n-type region is formed on an end surface side of the semiconductor substrate with respect to the outer peripheral back surface p-type region. The outer peripheral low concentration n-type region separates the outer peripheral back surface p-type region and the outer peripheral back surface n-type region from a contact outer peripheral edge p-type region. A p-type impurity concentration in the outer peripheral back surface p-type region decreases toward the end surface. An n-type impurity concentration in the outer peripheral back surface n-type region increases toward the end surface.

6 Claims, 11 Drawing Sheets

SEMICONDUCTOR DEVICE

INCORPORATION BY REFERENCE

The disclosure of Japanese Patent Application No. 2013-260272 filed on Dec. 17, 2013 including the specification, drawings and abstract is incorporated herein by reference in its entirety.

BACKGROUND OF THE INVENTION

1. Field of the Invention

The present invention relates to a semiconductor device.

2. Description of Related Art

Japanese Patent Application Publication No. 09-232597 (JP 09-232597 A) discloses a semiconductor device that includes an Insulated Gate Bipolar Transistor (IGBT) and a diode. In the semiconductor device, the IGBT and the diode are formed in a main region of a semiconductor substrate. Further, a withstand voltage structure is formed in an outer peripheral region between the main region and an end surface of the semiconductor substrate.

In the semiconductor device of JP 09-232597 A, an n-type region (hereinafter, referred to as an outer peripheral back surface n-type region) is formed in a range exposed on a back surface of the semiconductor substrate in the outer peripheral region. The outer peripheral back surface n-type region is electrically conductive with a back surface electrode. Therefore, when the diode is turned on, holes flow from a p-type region in the main region (an anode region of the diode or a body region of the IGBT) toward the outer peripheral back surface n-type region. When the diode performs a reverse recovery operation, the holes present in the outer peripheral region flow toward the p-type region in the main region. Therefore, a current is concentrated in the p-type region in the vicinity of the outer peripheral region of the p-type region in the main region.

Further, in a range exposed on the back surface of the semiconductor substrate in the outer peripheral region, the p-type region (hereinafter, referred to as an outer peripheral back surface p-type region) can be formed in place of the n-type region described above. In the case in which the outer peripheral back surface p-type region is formed in this way, when the IGBT is turned on, the holes are supplied from the outer peripheral back surface p-type region toward a drift region in the outer peripheral region. When the IGBT is turned off, the holes present in the outer peripheral region flow to the p-type region in the main region. Therefore, the current is concentrated in the p-type region in the vicinity of the outer peripheral region of the p-type region in the main region.

SUMMARY OF THE INVENTION

As described above, when the outer peripheral back surface n-type region is formed in the outer peripheral region, a high current flows into the p-type region in the vicinity of the outer peripheral region during a reverse recovery operation of the diode. Further, when the outer peripheral back surface p-type region is formed in the outer peripheral region, during turning off of the IGBT, the high current flows to the p-type region in the vicinity of the outer peripheral region.

The present invention provides a semiconductor device that can suppress the high current flow during the reverse recovery operation of the diode and during the IGBT being turned off.

A semiconductor device according to a first aspect of the present invention includes: a semiconductor substrate in which an IGBT and a diode are formed; a front surface electrode formed on a front surface of the semiconductor substrate; and a back surface electrode formed on a back surface of the semiconductor substrate. An n-type emitter region of the IGBT, a p-type body region of the IGBT, and a p-type anode region of the diode are formed in a range exposed on the front surface in the semiconductor substrate. The n-type emitter region is connected with the front surface electrode. The p-type body region is connected with the front surface electrode. The p-type anode region is connected with the front surface electrode. A p-type collector region of the IGBT, and an n-type cathode region of the diode are formed in a range exposed on the back surface in the semiconductor substrate. The p-type collector region is connected with the back surface electrode. The n-type cathode region is connected with the back surface electrode. A contact outer peripheral edge p-type region that is connected with the front surface electrode is formed in a range that contains an outer peripheral edge of a contact region of the front surface in the semiconductor substrate, the contact region being in contact with the front surface electrode. An outer peripheral back surface p-type region, an outer peripheral back surface n-type region, and an outer peripheral low concentration n-type region are formed in an outer peripheral region of the semiconductor substrate. The outer peripheral region is located between the outer peripheral edge and an end surface of the semiconductor substrate. The outer peripheral back surface p-type region is formed in a first range exposed on the back surface. When the semiconductor substrate is viewed in a plan view in a thickness direction, the outer peripheral edge is located in the first range. The outer peripheral back surface p-type region is connected with the back surface electrode. The outer peripheral back surface n-type region is formed in a second range that is located on a side of the end surface with respect to the outer peripheral back surface p-type region and exposed on the back surface. The outer peripheral back surface n-type region is in contact with the outer peripheral back surface p-type region. The outer peripheral back surface n-type region is connected with the back surface electrode. The outer peripheral low concentration n-type region has an n-type impurity concentration lower than an n-type impurity concentration of the outer peripheral back surface n-type region. The outer peripheral low concentration n-type region separates the outer peripheral back surface p-type region and the outer peripheral back surface n-type region from the contact outer peripheral edge p-type region. A p-type impurity concentration in the outer peripheral back surface p-type region decreases toward the end surface. The n-type impurity concentration in the outer peripheral back surface n-type region increases toward the end surface.

The body region and anode region described above may be constituted of a common region. That is, a predetermined p-type region may be constituted so as to work as the body region or the anode region. Further, the contact outer peripheral edge p-type region described above may be the anode region, the body region, or other region.

In the semiconductor device, the outer peripheral back surface p-type region and the outer peripheral back surface n-type region are formed in the outer peripheral region. The outer peripheral back surface p-type region is formed on the back surface side of the contact outer peripheral edge p-type region. That is, in a position close to the contact outer peripheral edge p-type region of the outer peripheral region, the outer peripheral back surface p-type region is formed. Since the holes are supplied from the outer peripheral back surface p-type region to the outer peripheral low concentration n-type region when the IGBT is in on state, the holes flow from the outer peripheral low concentration n-type region to the contact outer peripheral edge p-type region when the IGBT is in off state. Here, in the outer peripheral back surface p-type region, the p-type impurity concentration decreases toward the end surface of the semiconductor substrate. Therefore, when the IGBT is being turned on, the closer to the end surface of the semiconductor substrate position is (that is, as going the outer peripheral side), the scarcer the holes supplied from the outer peripheral back surface p-type region are. Therefore, when the IGBT is turned off, the holes that flow from the outer peripheral low concentration n-type region to the contact outer peripheral edge p-type region are scarce. Thus, when the IGBT is turned off, the high current flow toward the contact outer peripheral edge p-type region can be suppressed. Further, when the diode is turned on, the holes flow from the contact outer peripheral edge p-type region toward the outer peripheral back surface n-type region. When the diode performs the reverse recovery operation, the holes present in the outer peripheral low concentration n-type region flow to the contact outer peripheral edge p-type region. Here, the outer peripheral back surface n-type region is disposed on the end surface side (that is, a side far from the contact outer peripheral edge p-type region) of the semiconductor substrate of the outer peripheral back surface p-type region. Further, in the outer peripheral back surface n-type region, the n-type impurity concentration increases toward the end surface of the semiconductor substrate (that is, the impurity concentration decreases toward the contact outer peripheral edge p-type region). Thus, the outer peripheral back surface n-type region is far from the contact outer peripheral edge p-type region, and, the n-type impurity concentration is lower in a region close to the contact outer peripheral edge p-type region of the outer peripheral back surface n-type region. Therefore, when the diode is being turned on, the holes that flow toward the outer peripheral back surface n-type region are very scarce. That is, when the diode is being turned on, the holes present in the outer peripheral region are very scarce. Therefore, when the diode performs the reverse recovery operation, the high current is suppressed from flowing into the contact outer peripheral edge p-type region. Thus, according to the semiconductor device, in during the reverse recovery operation of the diode and during turning off of the IGBT, the generation of high current can be suppressed.

In the semiconductor device according to the first aspect of the present invention, when the semiconductor substrate is viewed in a plan view in a thickness direction, a p-type impurity concentration in a boundary of the outer peripheral back surface p-type region and the outer peripheral back surface n-type region in a first region may be lower than a p-type impurity concentration in the boundary in a second region. Furthermore, when the semiconductor substrate is viewed in a plan view in a thickness direction, the first region may be located between a corner part of the end surface and a corner part of the outer peripheral edge. Furthermore, when the semiconductor substrate is viewed in a plan view in a thickness direction, the second region may be located between a straight line part of the end surface and the straight line part of the outer peripheral edge.

According to the configuration like this, in the outer peripheral region in the vicinity of the corner part of the contact region in which an electric field is likely to be concentrated, the electric field can be suppressed.

A semiconductor device according to a second aspect of the present invention includes: a semiconductor substrate in which an IGBT and a diode are formed; a front surface electrode formed on a front surface of the semiconductor substrate; and a back surface electrode formed on a back surface of the semiconductor substrate. An n-type emitter region of the IGBT, a p-type body region of the IGBT, and a p-type anode region of the diode are formed in a range exposed on the front surface in the semiconductor substrate. The n-type emitter region is connected with the front surface electrode. The p-type body region is connected with the front surface electrode. The p-type anode region is connected with the front surface electrode. A p-type collector region of the IGBT, and an n-type cathode region of the diode are formed in a range exposed on the back surface in the semiconductor substrate. The p-type collector region is connected with the back surface electrode. The n-type cathode region is connected with the back surface electrode. A contact outer peripheral edge p-type region that is connected with the front surface electrode is formed in a range that contains an outer peripheral edge of a contact region of the front surface in the semiconductor substrate, the contact region being in contact with the front surface electrode. An outer peripheral back surface p-type region, an outer peripheral back surface n-type region, an outer peripheral back surface pn repetitive region, and an outer peripheral low concentration n-type region are formed in an outer peripheral region of the semiconductor substrate. The outer peripheral region is located between the outer peripheral edge and an end surface of the semiconductor substrate. The outer peripheral back surface p-type region is formed in a first range exposed on the back surface. When the semiconductor substrate is viewed in a plan view in a thickness direction, the outer peripheral edge is located in the first range. The outer peripheral back surface p-type region is connected with the back surface electrode. The outer peripheral back surface n-type region is formed in a second range that is located on a side of the end surface with respect to the outer peripheral back surface p-type region and exposed on the back surface. The outer peripheral back surface n-type region is connected with the back surface electrode. The outer peripheral back surface pn repetitive region is formed in a third range that is located between the outer peripheral back surface p-type region and the outer peripheral back surface n-type region and exposed on the back surface. The outer peripheral back surface pn repetitive region is connected with the back surface electrode. P-type regions and n-type regions are alternately and repeatedly formed in the outer peripheral back surface pn repetitive region in a direction from the outer peripheral back surface p-type region toward the outer peripheral back surface n-type region. The outer peripheral low concentration n-type region has an n-type impurity concentration lower than an n-type impurity concentration of the respective n-type regions and the outer peripheral back surface n-type region in the outer peripheral back surface pn repetitive region. The outer peripheral low concentration n-type region separates the outer peripheral back surface p-type region, the outer peripheral back surface n-type region and the outer peripheral pn repetitive region from the contact outer peripheral edge p-type region. When the semiconductor substrate is viewed in a plan view in a thickness direction, an area ratio of the p-type regions to the n-type regions in the outer peripheral back surface pn repetitive region is higher in a range on a side of the outer peripheral back surface p-type region with respect to a center of the outer peripheral back surface pn repetitive region than in a range on a side of the outer peripheral back surface n-type region with respect to the center of the outer peripheral back surface pn repetitive region.

In the semiconductor device, in the outer peripheral back surface pn repetitive region between the outer peripheral back surface p-type region and the outer peripheral back surface n-type region, the area ratio of the p-type region to the n-type region in the range (hereinafter referred to as outer peripheral back surface p-type region side range) on the outer peripheral back surface p-type region side of the center in the outer peripheral back surface pn repetitive region is higher than the area ratio in the range (hereinafter referred to as outer peripheral back surface n-type region side range) on the outer peripheral back surface n-type region side of the center in the outer peripheral back surface pn repetitive region. When the area ratio is distributed like this, an average value of the p-type impurity concentration becomes lower in the outer peripheral back surface n-type region side range than in the outer peripheral back surface p-type region side range, and the average value of the n-type impurity concentration becomes higher in the outer peripheral back surface p-type region side range than in the outer peripheral back surface n-type region side range. Therefore, in the same manner as the above-described first semiconductor device, the high current can be suppressed from being generated during the reverse recovery operation of the diode and during turning off of the IGBT.

In the semiconductor device according to the second aspect of the present invention, the closer to the outer peripheral back surface p-type region each of the p-type regions in the outer peripheral back surface pn repetitive region is, the broader widths the each of the p-type regions may have in the direction from the outer peripheral back surface p-type region toward the outer peripheral back surface n-type region. Furthermore, the closer to the outer peripheral back surface n-type region each of the n-type regions in the outer peripheral back surface pn repetitive region is, the broader widths the each of the n-type regions may have in the direction from the outer peripheral back surface p-type region toward the outer peripheral back surface n-type region.

In the semiconductor device according to the second aspect of the present invention, when the semiconductor substrate is viewed in a plan view in a thickness direction, the outer peripheral back surface pn repetitive region may be formed so as to surround the contact region.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
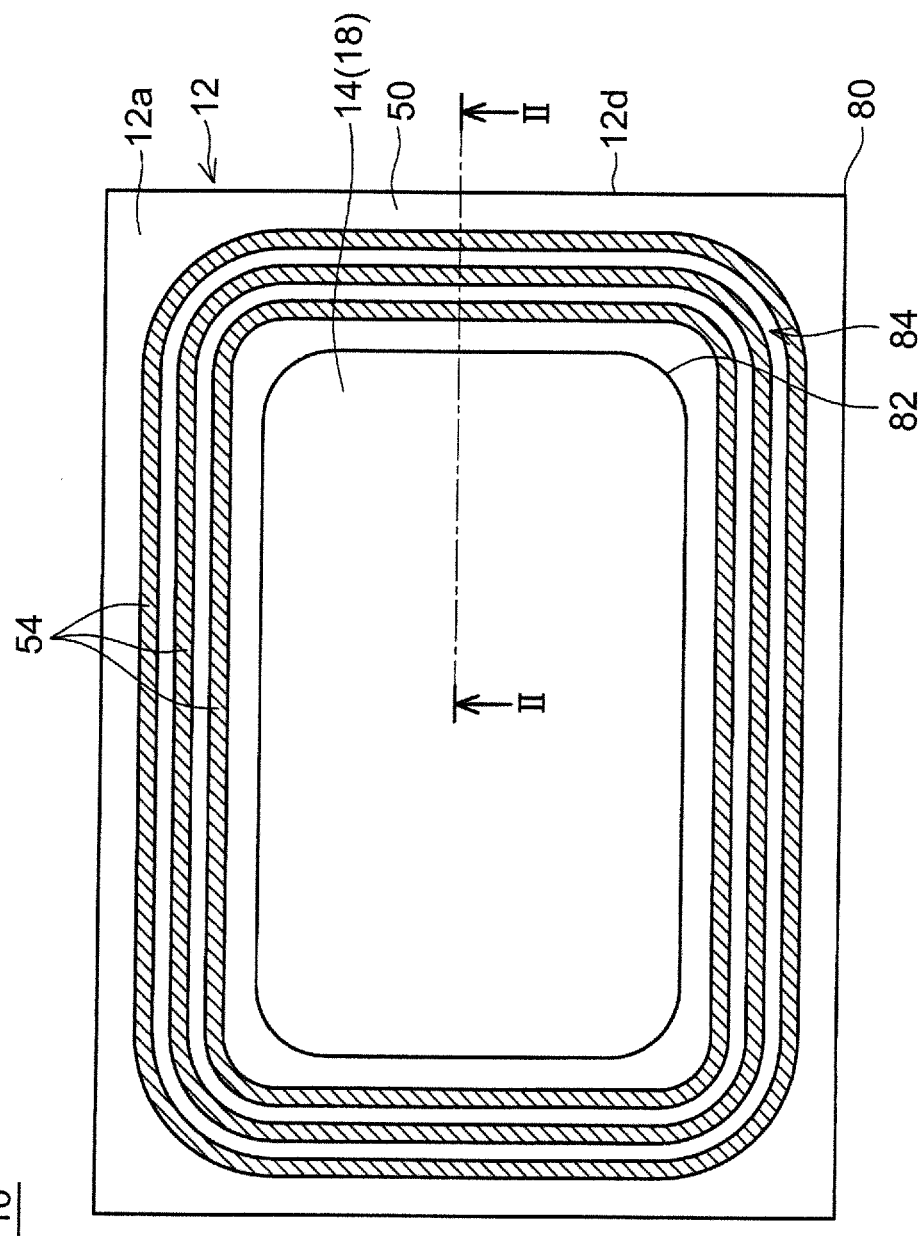
FIG. 1 is a plan view of a semiconductor device 10 of a first embodiment of the present invention, in which an insulation film of an outer peripheral region 50 is omitted from illustrating.
Figure 2:
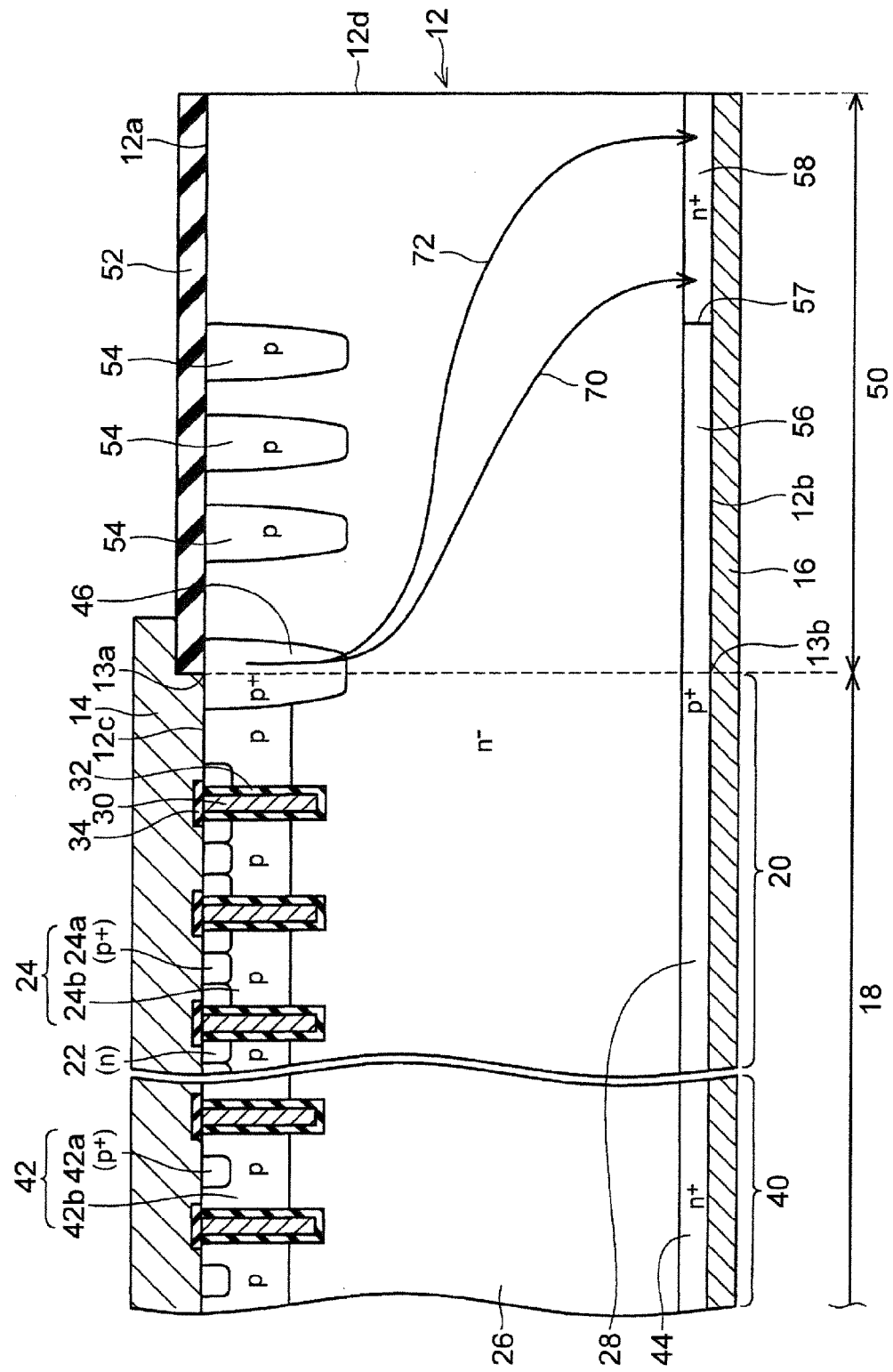
FIG. 2 is a vertical cross-sectional view of the semiconductor device 10 in a II-II line of FIG. 1.

A semiconductor device 10 of a first embodiment of the present invention shown in FIG. 1 includes a semiconductor substrate 12. As shown in FIGS. 1 and 2, in a center of a front surface 12a of the semiconductor substrate 12, a front surface electrode 14 is formed. The front surface electrode 14 is formed of Al or AlSi. Further, as shown in FIG. 2, over an entire back surface 12b of the semiconductor substrate 12, a back surface electrode 16 is formed. The back surface electrode 16 is formed by stacking the respective layers of Ti, Ni, and Au on a surface of an Al layer or an AlSi layer, which is in contact with the back surface 12b of the semiconductor substrate 12. Hereinafter, a region that is in contact with the front surface electrode 14 of the front surface 12a of the semiconductor substrate 12 is called as a contact region 12c. Further, an entire semiconductor region on a lower side of the contact region 12c is called as a cell region 18. Further, a region outside of the cell region 18 (a region between the cell region 18 and an end surface 12d of the semiconductor substrate 12) is called as an outer peripheral region 50.

An IGBT 20 and a diode 40 are formed in the cell region 18. The IGBT 20 is formed in a position close to the outer peripheral region 50 in the cell region 18. The diode 40 is formed in a position separated from the outer peripheral region 50 in the cell region 18.

The IGBT 20 includes an emitter region 22, a body region 24, a drift region 26, a collector region 28, and a gate electrode 30.

The emitter region 22 is an n-type region and formed in a range exposed on the front surface 12a of the semiconductor substrate 12. The emitter region 22 is in an ohmic connection with the front surface electrode 14.

The body region 24 is a p-type region and formed in a position adjacent to the emitter region 22. The body region 24 includes a high concentration body region 24a and a low concentration body region 24b. The high concentration body region 24a is formed in a range exposed on the front surface 12a of the semiconductor substrate 12 in a range in which the emitter region 22 is not formed. The high concentration body region 24a is in an ohmic connection with the front surface electrode 14. The low concentration body region 24b is formed on a lower side of the emitter region 22 and the high concentration body region 24a. The p-type impurity concentration of the low concentration body region 24b is lower than the p-type impurity concentration of the high concentration body region 24a.

The drift region 26 is an n-type region and has a low n-type impurity concentration. The drift region 26 is formed on a lower side of the body region 24. The drift region 26 is separated from the emitter region 22 by the body region 24.

The collector region 28 is a p-type region and formed on a lower side of the drift region 26. The collector region 28 is formed in the range exposed on the back surface 12b of the semiconductor substrate 12. The collector region 28 is in an ohmic connection with the back surface electrode 16.

A plurality of trenches is formed on the front surface 12a of the semiconductor substrate 12. An inner surface of each of the trenches is covered with a gate insulation film 32. The gate electrode 30 is disposed in the trench. Each of the trenches penetrates through the emitter region 22 and the body region 24 and reaches the drift region 26. Therefore, the gate electrode 30 faces the emitter region 22, the body region 24 and the drift region 26 via the gate insulation film 32. An upper surface of the gate electrode 30 is covered with an insulation film 34. The gate electrode 30 is insulated from the front surface electrode 14 by the insulation film 34.

The diode 40 includes an anode region 42, the drift region 26, and a cathode region 44.

The anode region 42 is a p-type region and formed in the range exposed on the front surface 12a of the semiconductor substrate 12. The anode region 42 includes a high concentration anode region 42a and a low concentration anode region 42b. The high concentration anode region 42a is formed in the range exposed on the front surface 12a of the semiconductor substrate 12. The high concentration anode region 42a is in an ohmic connection with the front surface electrode 14. The low concentration anode region 42b is formed on a lateral side and lower side of the high concentration anode region 42a. The p-type impurity concentration of the low concentration anode region 42b is lower than the p-type impurity concentration of the high concentration anode region 42a.

The drift region 26 of the diode 40 is an n-type region and formed on a lower side of the anode region 42. The drift region 26 of the diode 40 is a layer continuous with the drift region 26 of the IGBT 20 described above. The drift region 26 of the diode 40 has the same low n-type impurity concentration as the drift region 26 of the IGBT 20.

The cathode region 44 is an n-type region and has the n-type impurity concentration higher than that of the drift region 26. The cathode region 44 is formed on a lower side of the drift region 26. The cathode region 44 is formed in the range exposed on the back surface 12b of the semiconductor substrate 12. The cathode region 44 is in an ohmic connection with the back surface electrode 16.

An outer peripheral edge p-type region 46 is formed in a range, of the semiconductor substrate 12, that contains the outer peripheral edge 13a of the contact region 12c. The outer peripheral edge p-type region 46 is a region in which B as the p-type impurity is implanted at a concentration of $1 \times 10^{13}$ to $1 \times 10^{16}$ cm$^{-2}$. The outer peripheral edge p-type region 46 extends from the front surface 12a of the semiconductor substrate 12 to a position deeper than a lower end of the low concentration body region 24b. The outer peripheral edge p-type region 46 is continuous with the body region 24. Therefore, the outer peripheral edge p-type region 46 can be assumed as a part of the body region 24. The outer peripheral edge p-type region 46 has a high p-type impurity concentration and is in an ohmic connection with the front surface electrode 14.

The front surface 12a in the outer peripheral region 50 is covered with an insulation film 52. Three guard rings 54 are formed in the range exposed on the front surface 12a of the outer peripheral region 50. Each of the guard rings 54 is a p-type region. As shown in FIG. 1, each of the guard rings 54 is formed so as to surround the front surface electrode 14 (that is, cell region 18). The drift region 26 described above is formed on a lateral side and a lower side of each of the guard rings 54. That is, the drift region 26 extends from the inside of the cell region 18 to the inside of the outer peripheral region 50. Each of the guard rings 54 is separated from the outer peripheral edge p-type region 46 by the drift region 26. Further, each of the guard rings 54 is mutually separated by the drift region 26.

The collector region 28 of the IGBT 20 described above is also formed in the outer peripheral region 50. That is, the collector region 28 extends from the cell region 18 to the outer peripheral region 50. Also in the outer peripheral region 50, the collector region 28 is formed in the range exposed on the back surface 12b of the semiconductor substrate 12, and in an ohmic connection with the back surface electrode 16. Therefore, the collector region 28 is formed just below the outer peripheral edge 13a of the contact region 12c (a position shown with a reference numeral 13b of FIG. 2). The collector region 28 in the outer peripheral region 50 is separated from the outer peripheral edge p-type region 46 and the guard ring 54 by the drift region 26. Hereinafter, the collector region 28 that extends from the position 13b located just below the outer peripheral edge 13a to the inside of the outer peripheral region 50 is called as an outer peripheral back surface p-type region 56 in some cases. The outer peripheral back surface p-type region 56 is a region in which B as the impurity is implanted at a concentration of $1 \times 10^{12}$ to $1 \times 10^{15}$ cm$^{-2}$.

An outer peripheral back surface n-type region 58 is formed on an end surface 12d side of the outer peripheral back surface p-type region 56. The outer peripheral back surface n-type region 58 is a region in which P as the impurity is implanted at a concentration of $1 \times 10^{12}$ to $1 \times 10^{15}$ cm$^{-2}$. The outer peripheral back surface n-type region 58 is formed in the range exposed on the back surface 12b of the semiconductor substrate 12. The outer peripheral back surface n-type region 58 has the n-type impurity concentration higher than that of the drift region 26. The outer peripheral back surface n-type region 58 is in an ohmic connection with the back surface electrode 16. The outer peripheral back surface n-type region 58 is in contact with the outer peripheral back surface p-type region 56. Therefore, a pn junction 57 is formed therebetween.

Figure 3:
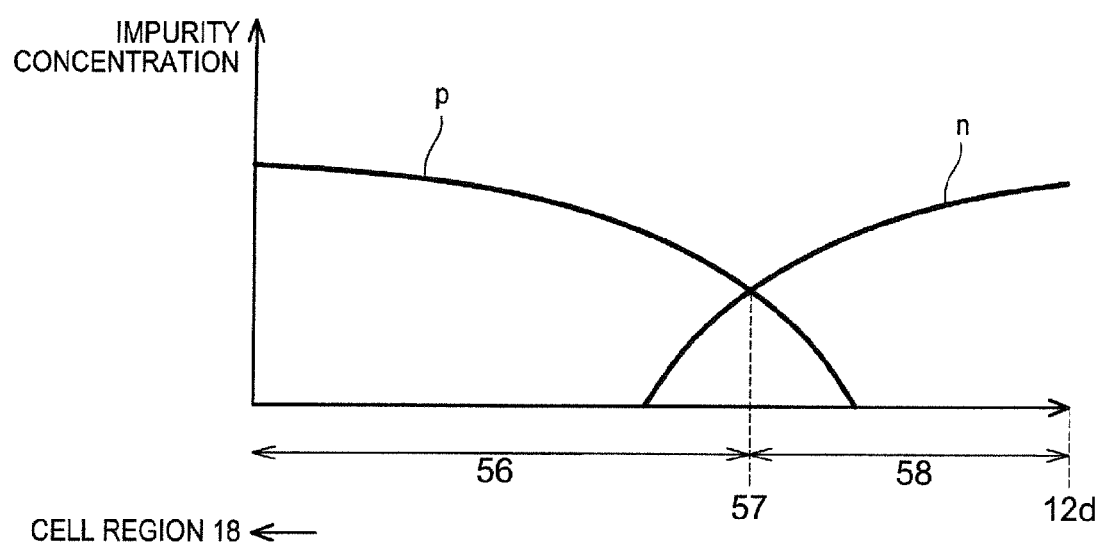
FIG. 3 is a graph that shows impurity concentration distributions in an outer peripheral back surface p-type region 56 and in an outer peripheral back surface n-type region 58.

FIG. 3 shows impurity concentration distributions in the outer peripheral back surface p-type region 56 and the outer peripheral back surface n-type region 58 in a direction from the cell region 18 toward the end surface 12d. As shown in FIG. 3, in the outer peripheral back surface p-type region 56, the p-type impurity concentration decreases from the cell region 18 side toward the end surface 12d side. Further, the n-type impurity concentration increases from the cell region 18 side toward the end surface 12d side in the outer peripheral back surface n-type region 58. Therefore, the p-type impurity concentration and the n-type impurity concentration in the pn junction 57 on a boundary between the outer peripheral back surface p-type region 56 and the outer peripheral back surface n-type region 58 become lower.

As shown in FIG. 1, the outer peripheral region 50 is formed so as to surround the cell region 18. A cross-sectional structure and a concentration distribution of the above-described outer peripheral region 50 are formed so as to surround the cell region 18. Therefore, also at any position of the outer peripheral region 50, the cross-sectional structure of the outer peripheral region 50 along a direction from the cell region 18 toward the end surface 12d has a structure shown in FIG. 2. Further, at any position of the outer peripheral region 50, the impurity concentration distributions in the outer peripheral back surface p-type region 56 and in the outer peripheral back surface n-type region 58 become the distributions shown in FIG. 3.

Next, an operation of the semiconductor device 10 will be described. When a potential of the front surface electrode 14 is higher than the potential of the back surface electrode 16, the diode 40 is turned on. That is, a current flows from the anode region 42 to the cathode region 44 via the drift region 26. Thereafter, when the potential of the back surface electrode 16 becomes higher than the potential of the front surface electrode 14, the diode 40 performs the reverse recovery operation. That is, the holes present in the drift region 26 are discharged to the front surface electrode 14 via the anode region 42, and a reverse current flows instantaneously to the diode 40.

On the other hand, in the outer peripheral region 50, a parasitic diode is formed of the outer peripheral edge p-type region 46, the drift region 26, and the outer peripheral back surface n-type region 58. Also the diode in the outer peripheral region 50 operates in the same manner as the diode 40 in the cell region 18. That is, when the potential of the front surface electrode 14 is higher than the potential of the back surface electrode 16, as shown with arrow marks 70 and 72 in FIG. 2, the current flows from the outer peripheral edge p-type region 46 to outer peripheral back surface n-type region 58. Thereafter, when the potential of the back surface electrode 16 becomes higher than the potential of the front surface electrode 14, the holes present in the drift region 26 in the outer peripheral region 50 flow in a reverse direction of the arrow marks 70 and 72 and flow in the outer peripheral edge p-type region 46. The holes are discharged from the outer peripheral edge p-type region 46 to the front surface electrode 14. At this time, since almost all of the holes present in the outer peripheral region 50 flow the outer peripheral edge p-type region 46, the current is concentrated in the outer peripheral edge p-type region 46. However, according to the semiconductor device 10 of the present embodiment, the outer peripheral back surface n-type region 58 is far from the outer peripheral edge p-type region 46 because the outer peripheral back surface n-type region 58 is formed on an end surface 12d side of the outer peripheral back surface p-type region 56. Further, since the n-type impurity concentration in the outer peripheral back surface n-type region 58 is lower to the cell region 18 side (that is, the outer peripheral edge p-type region 46 side), the outer peripheral back surface n-type region 58 at a position close to the cell region 18 has high resistance. Therefore, the current that flows as shown with the arrow mark 70 is extremely small. Further, the outer peripheral back surface n-type region 58 at a position close to the end surface 12d has a very long distance to the outer peripheral edge p-type region 46 while having a high n-type impurity concentration. Therefore, the current that flows as shown with the arrow mark 72 is very small. Thus, since the current that flows as shown with the arrow marks 70 and 72 when the diode 40 is turned on is very small, the holes that flow in a reverse direction of the arrow marks 70 and 72 when the diode 40 performs the reverse recovery operation are very scarce. Therefore, the high current can be suppressed from flowing to the outer peripheral edge p-type region 46.

When a predetermined potential (gate on potential) is applied to the gate electrode 30 in a state in which the potential of the back surface electrode 16 is higher than the potential of the front surface electrode 14, the IGBT 20 is turned on. That is, a channel is formed in the body region 24 at a position that faces against the gate electrode 30 and electrons flow from the emitter region 22 to the collector region 28 via the channel and the drift region 26. At the same time, the holes flow from the collector region 28 to the body region 24 via the drift region 26. Thereafter, when application of the gate on potential is stopped, the channel disappears and the IGBT 20 is turned off. At this time, the holes present in the drift region 26 are discharged to the front surface electrode 14 via the body region 24.

Figure 4:
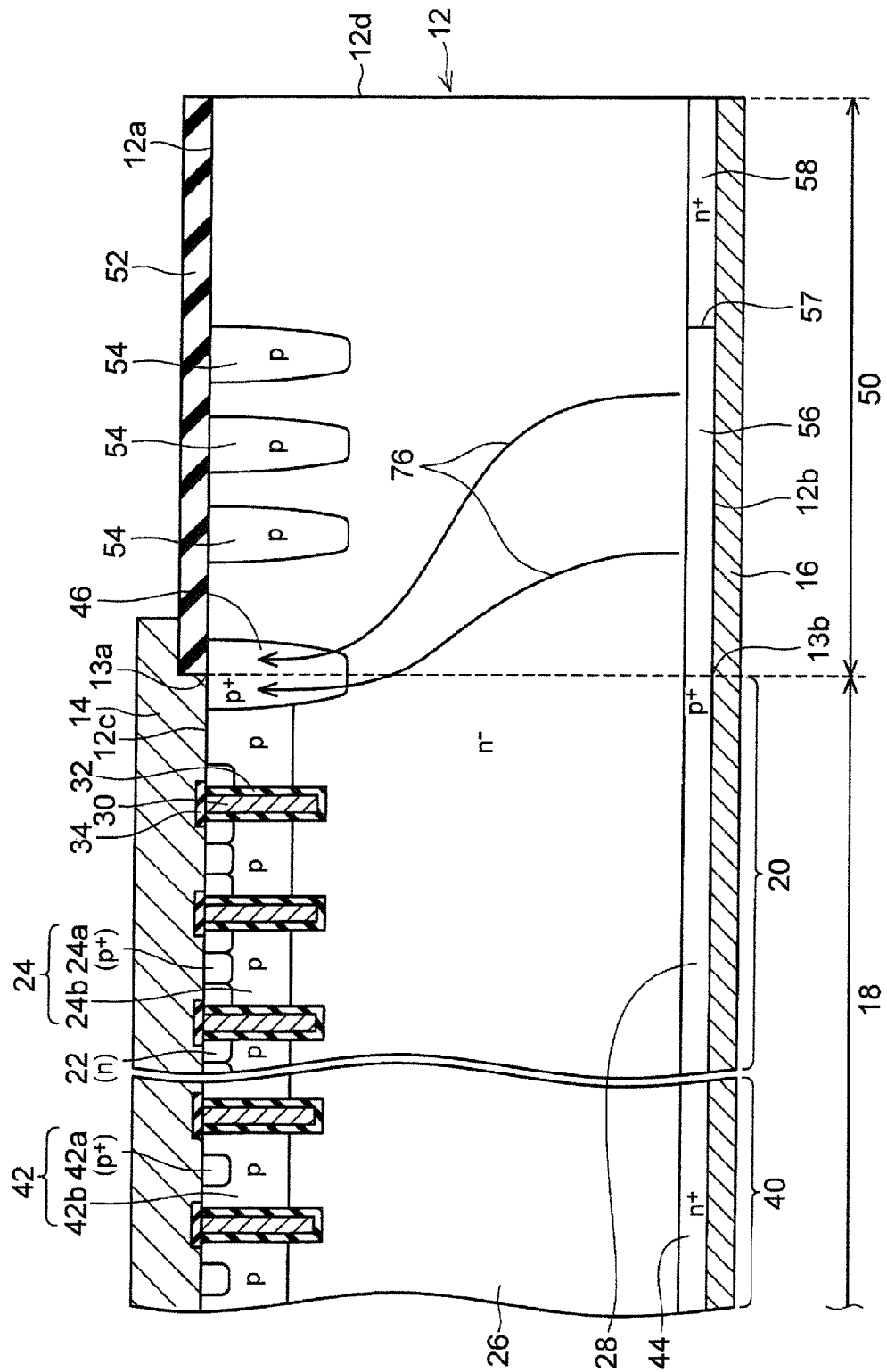
FIG. 4 is a vertical cross-sectional view of the semiconductor device 10 in a II-II line of FIG. 1.

When the IGBT 20 is operated, the collector region 28 in the outer peripheral region 50 (that is, the outer peripheral back surface p-type region 56) is also operated. Therefore, the holes are supplied from the outer peripheral back surface p-type region 56 to the drift region 26 in the outer peripheral region 50. When the IGBT 20 is turned off, most of the holes in the outer peripheral region 50 are discharged to the front surface electrode 14 via the outer peripheral edge p-type region 46 as shown with an arrow mark 76 of FIG. 4. Therefore, the current is concentrated in the outer peripheral edge p-type region 46. However, according to the semiconductor device 10 of the present embodiment, the p-type impurity concentration in the outer peripheral back surface p-type region 56 becomes lower as departing from the cell region 18. For this reason, when the IGBT 20 is turned on, the holes that are supplied from the outer peripheral back surface p-type region 56 to the drift region 26 are extremely scarce. Therefore, when the IGBT 20 is turned off, the current that flow as shown in the arrow mark 76 are very scarce. For this reason, the high current is suppressed from flowing to the outer peripheral edge p-type region 46.

As described above, according to the semiconductor device 10 of the first embodiment, the high current can be suppressed from flowing to the outer peripheral edge p-type region 46 in during the reverse recovery operation of the diode 40 and during turning off of the IGBT 20.

Further, according to a configuration of the first embodiment, the p-type impurity concentration and the n-type impurity concentration in the pn junction 57 of a boundary of the outer peripheral back surface p-type region 56 and the outer peripheral back surface n-type region 58 can be made smaller. When the respective impurity concentrations in the pn junction 57 are low like this, a high electric field is not easily produced in the pn junction 57. Therefore, even when the pn junction 57 is formed in the outer peripheral region 50, a high withstand voltage of the outer peripheral region 50 can be maintained.

Further, many crystal defects formed by dicing or the like are present on the end surface 12d. Therefore, in the vicinity of the end surface 12d, there is a case in which a state of an interface between the back surface electrode 16 and the semiconductor substrate 12 is not preferable or a case in which voids are generated when the back surface electrode 16 is connected with the external terminal by a solder or the like. Therefore, resistance between the semiconductor substrate 12 and the back surface electrode 16 (or, an external terminal) tends to be higher in the vicinity of end surface 12d, and heat generation is likely to occur in the vicinity of the end surface 12d thereby. However, according to the semiconductor device 10 of the first embodiment, the n-type impurity concentration in the outer peripheral back surface n-type region 58 is higher to the end surface 12d side. Therefore, the resistance between the semiconductor substrate 12 and the back surface electrode 16 (or an external terminal) in the vicinity of the end surface 12d is reduced. Thus, the heat generation in the vicinity of the end surface 12d is suppressed.

In the above-described first embodiment, a high electric field tends to be produced in a region 84 (see FIG. 1) between a corner part 80 of the end surface 12d of the semiconductor substrate 12 and a corner part 82 of an outer peripheral edge of the contact region 12c of the outer peripheral region 50 than in other outer peripheral region 50 (that is, a region between a straight line part of the end surface 12d and a straight line part of the outer peripheral edge of the contact region 12c).

Therefore, it is preferable to make the p-type impurity concentration and the n-type impurity concentration lower in the pn junction 57 formed in the region 84 between the corner parts than the pn junction 57 formed in a region between the straight line parts. According to the configuration like this, the high electric field can be preferably suppressed from being generated in the pn junction in the region 84 between the corner parts.

Figure 5:
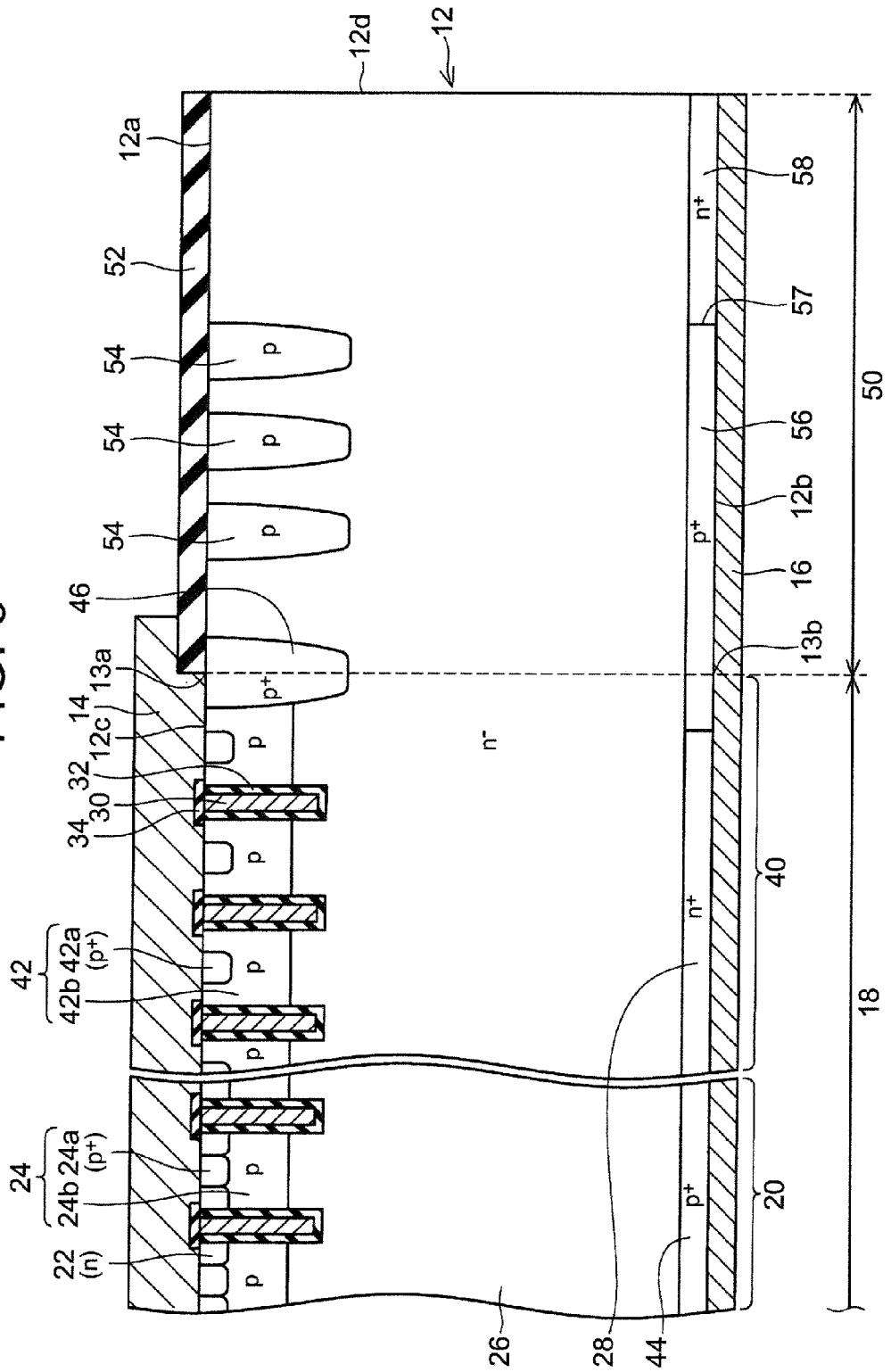
FIG. 5 is a vertical cross-sectional view that shows a first variation of the semiconductor device 10 of the first embodiment.

Further, in the above-described embodiment, the IGBT 20 is formed on the outer peripheral region 50 side of the diode 40. However, as shown in FIG. 5, the diode 40 may be formed on the outer peripheral region 50 side of the IGBT 20. In this case, the outer peripheral back surface p-type region 56 is formed over from a region on the back surface side of the outer peripheral edge 13a of the contact region 12c to the inside of the outer peripheral region 50. Thus, the outer peripheral back surface n-type region 58 can be formed on the end surface 12d side of the outer peripheral back surface p-type region 56. Also in this case, by distributing the impurity concentrations in the outer peripheral back surface p-type region 56 and the outer peripheral back surface n-type region 58 like in the first embodiment, the same effect as the first embodiment can be obtained.

Figure 6:
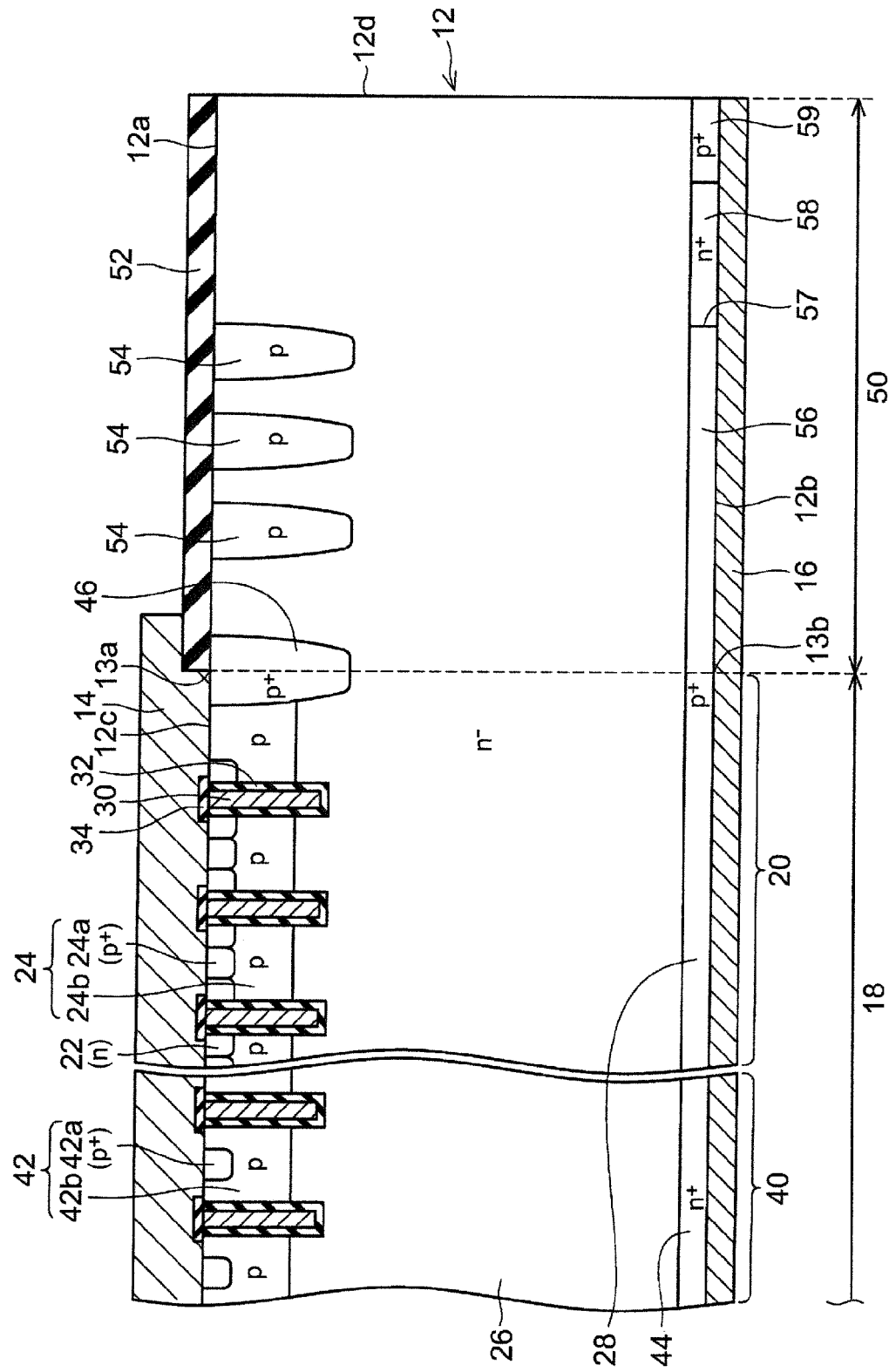
FIG. 6 is a vertical cross-sectional view that shows a second variation of the semiconductor device 10 of the first embodiment 1.

Further, as shown in FIG. 6, a p-type region 59 may be formed on the end surface 12d side of the outer peripheral back surface n-type region 58. Also according to the configuration like this, the effect the same as the first embodiment can be obtained.

Figure 7:
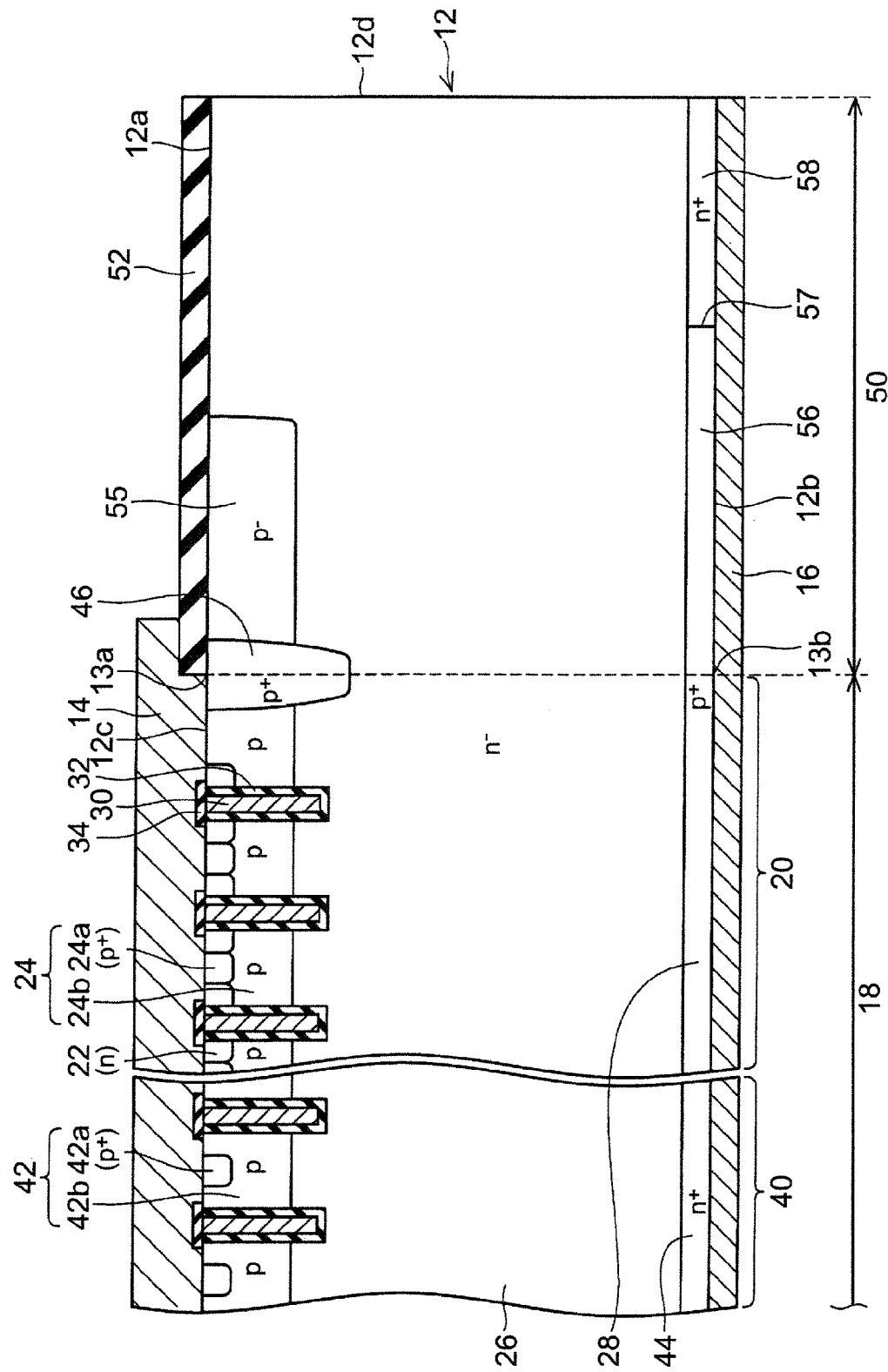
FIG. 7 is a vertical cross-sectional view that shows a third variation of the semiconductor device 10 of the first embodiment.

Further, as shown in FIG. 7, a resurf region 55 may be formed in place of the guard ring 54.

Figure 8:
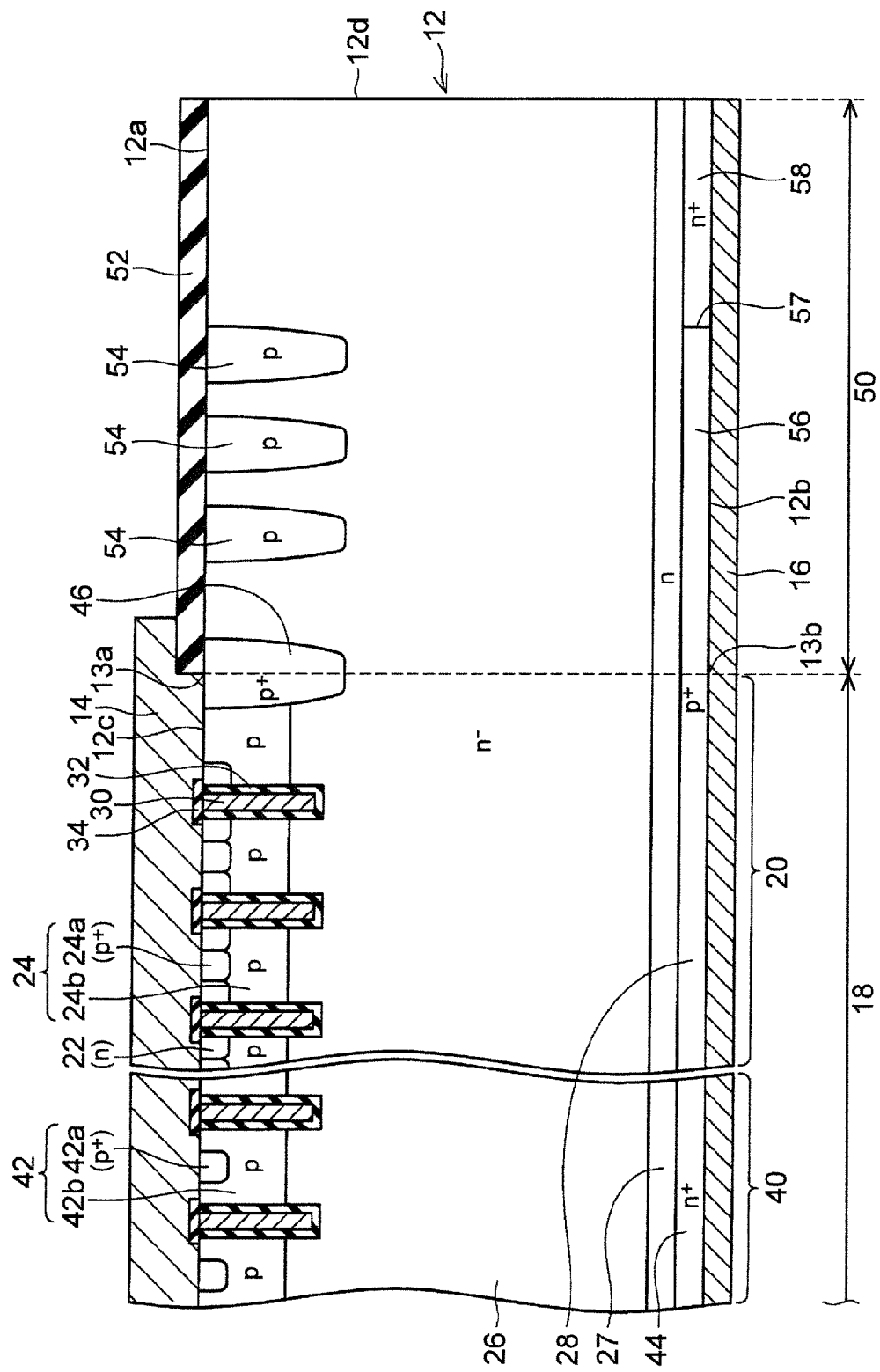
FIG. 8 is a vertical cross-sectional view that shows a fourth variation of the semiconductor device 10 of the first embodiment.

Further, as shown in FIG. 8, an n-type buffer region 27 may be formed between a region exposed on the back surface 12b of the semiconductor substrate 12 (that is, the cathode region 44, the collector region 28, and the outer peripheral back surface n-type region 58) and the drift region 26. The n-type impurity concentration of the buffer region 27 is higher than that of the drift region 26 and lower than these of the cathode region 44 and the outer peripheral back surface n-type region 58.

Figure 9:
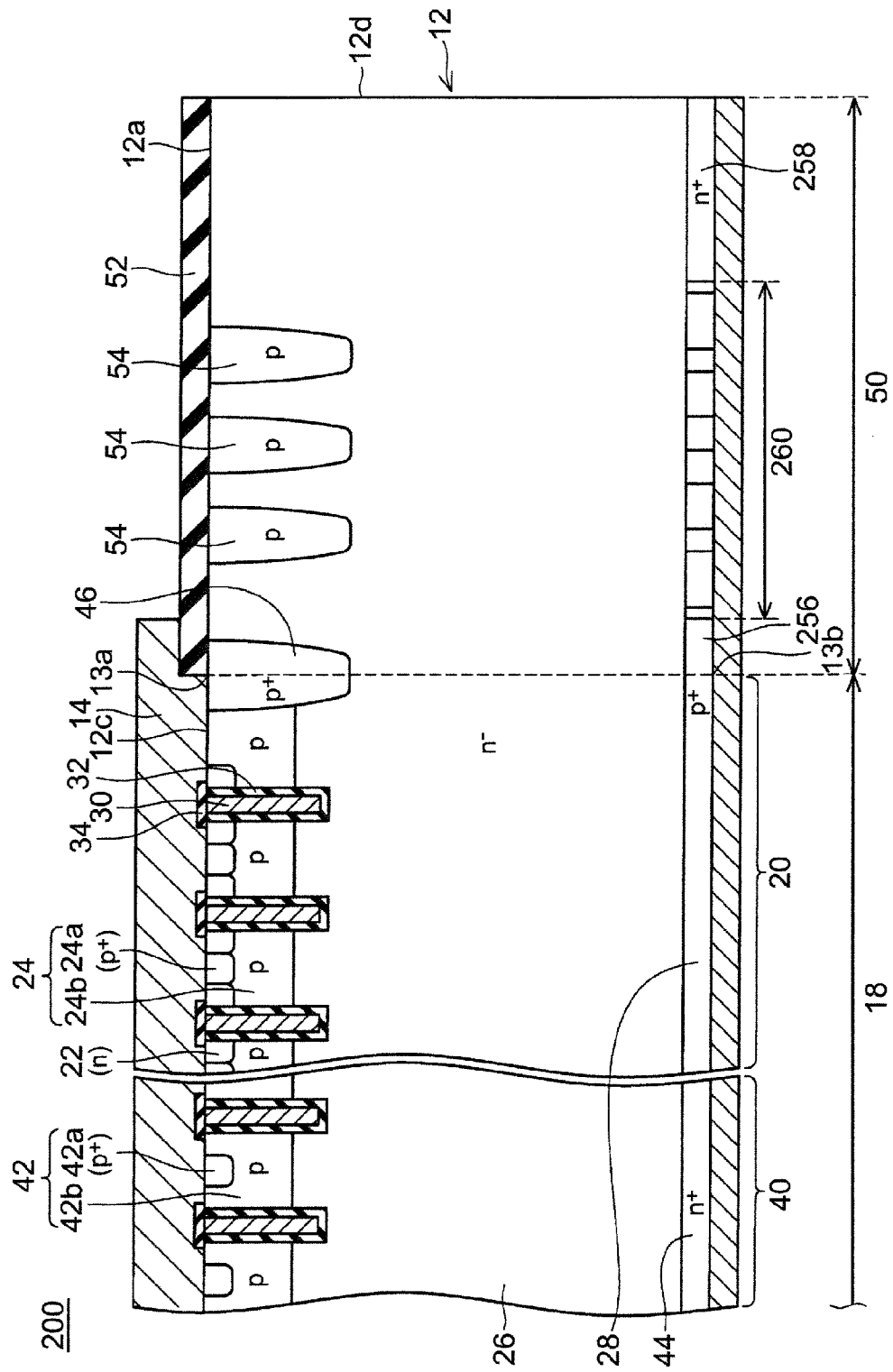
FIG. 9 is a vertical cross-sectional view of a semiconductor device 200 of a second embodiment of the present invention.

A semiconductor device 200 according to a second embodiment of the present invention shown in FIG. 9 has the same structure as the semiconductor device 10 of the first embodiment except the structure on the back surface 12b side of the outer peripheral region 50. Therefore, hereinafter, only the structure on the end surface 12d side of the outer peripheral region 50 will be described in detail.

An outer peripheral back surface p-type region 256 is formed in the semiconductor device 200 of the second embodiment so as to extend from the position 13b on the back surface side of the outer peripheral edge 13a of the contact region 12c to the inside of the outer peripheral region 50. In the outer peripheral back surface p-type region 256, the p-type impurity is distributed at a substantially constant concentration. The outer peripheral back surface p-type region 256 is a part of the collector region 28 of the IGBT 20. Further, the outer peripheral back surface n-type region 258 is formed on the end surface 12d side of the semiconductor substrate 12. The n-type impurity is distributed at a substantially constant concentration in the outer peripheral back surface n-type region 258.

Figure 10:
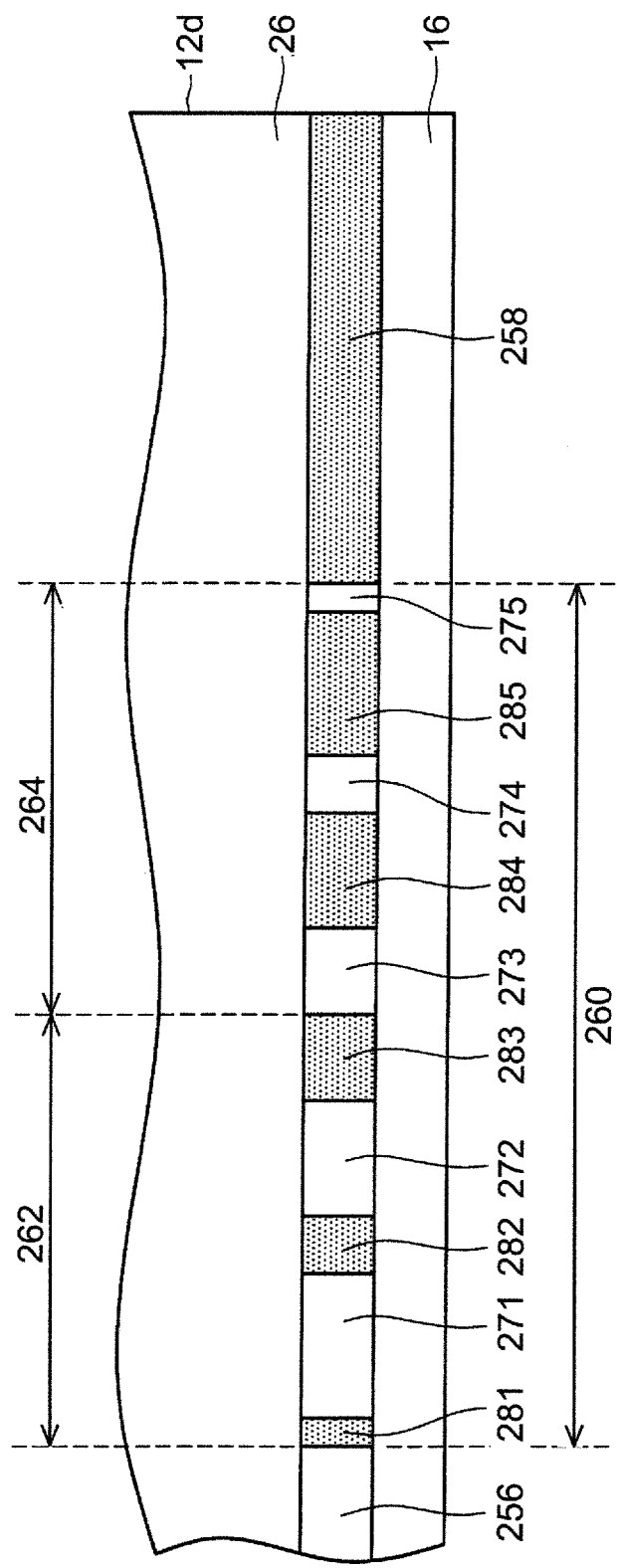
FIG. 10 is an enlarged cross-sectional view of an outer peripheral back surface pn repetitive region 260 of the second embodiment.

An outer peripheral back surface pn repetitive region 260 is formed between the outer peripheral back surface p-type region 256 and the outer peripheral back surface n-type region 258. As shown in FIG. 10, the outer peripheral back surface pn repetitive region 260 includes a plurality of p-type regions 271 to 275 and a plurality of the n-type regions 281 to 285. In FIG. 10, the n-type regions 281 to 285 and the outer peripheral back surface n-type region 258 are shown by dot hatching, considering a visibility of the drawing. As shown in the drawing, the p-type regions 271 to 275 and the n-type regions 281 to 285 are alternately and repeatedly arranged in a direction from the outer peripheral back surface p-type region 256 toward the outer peripheral back surface n-type region 258.

A cross-sectional structure in the outer peripheral region 50 of the semiconductor device 200 of the second embodiment shown in FIG. 9 is formed so as to surround the cell region 18. Therefore, at any position of the outer peripheral region 50, the cross-sectional structure of the outer peripheral region 50 along a direction from the cell region 18 toward the end surface 12d has a structure shown in FIG. 9. That is, the outer peripheral back surface pn repetitive region 260 is formed in a ring shape that surrounds a circumference of the cell region 18.

As shown in FIG. 10, widths of the p-type regions 271 to 275 (widths in a direction from the outer peripheral back surface p-type region 256 toward the outer peripheral back surface n-type region 258) become broader to the outer peripheral back surface p-type region 256 and narrower to the outer peripheral back surface n-type region 258. Widths of the n-type regions 281 to 285 become narrower to the outer peripheral back surface p-type region 256 and broader to the outer peripheral back surface n-type region 258. Therefore, when the semiconductor substrate 12 is viewed in a plan view in a thickness direction, an area ratio of the p-type region to the n-type region is higher in a region 262 on the outer peripheral back surface p-type region 256 side of a center part of the outer peripheral back surface pn repetitive region 260 (a center part in the width direction) than in the region 264 on the outer peripheral back surface n-type region 258 side of the center part of the outer peripheral back surface pn repetitive region 260. Therefore, an average concentration of the p-type impurity is higher in the region 262 than in the region 264, and the average concentration of the n-type impurity is higher in the region 264 than in the region 262. That is, in a macroscopic view, the p-type impurity concentration in the outer peripheral back surface pn repetitive region 260 decreases toward the end surface 12d and the n-type impurity concentration increases toward the end surface 12d. Therefore, also according to the semiconductor device 200 of the second embodiment, the same effect as the semiconductor device 10 of the first embodiment can be obtained. That is, for the semiconductor device 200 of the second embodiment also, the high current can be prevented from flowing to the outer peripheral edge p-type region 46 during the reverse recovery operation of the diode 40 and during turning off of the IGBT 20.

Further, when a plurality of the p-type regions and n-type regions, which are finely divided, are formed between the outer peripheral back surface p-type region 56 and the outer peripheral back surface n-type region 58 like the second embodiment, even in the case in which the carriers are concentrated in any one of these p-type regions and the n-type regions, an influence thereof can be made definitive. For example, it is assumed that any one of these p-type regions and the n-type regions is erroneously turned on for any reason during use of the semiconductor device 200. In the semiconductor device 200 of the second embodiment, even when any of the regions is erroneously turned on, other regions are suppressed from being turned on since the respective p-type regions and n-type regions are finely divided. Therefore, the effect thereof can be made definitive.

Figure 11:
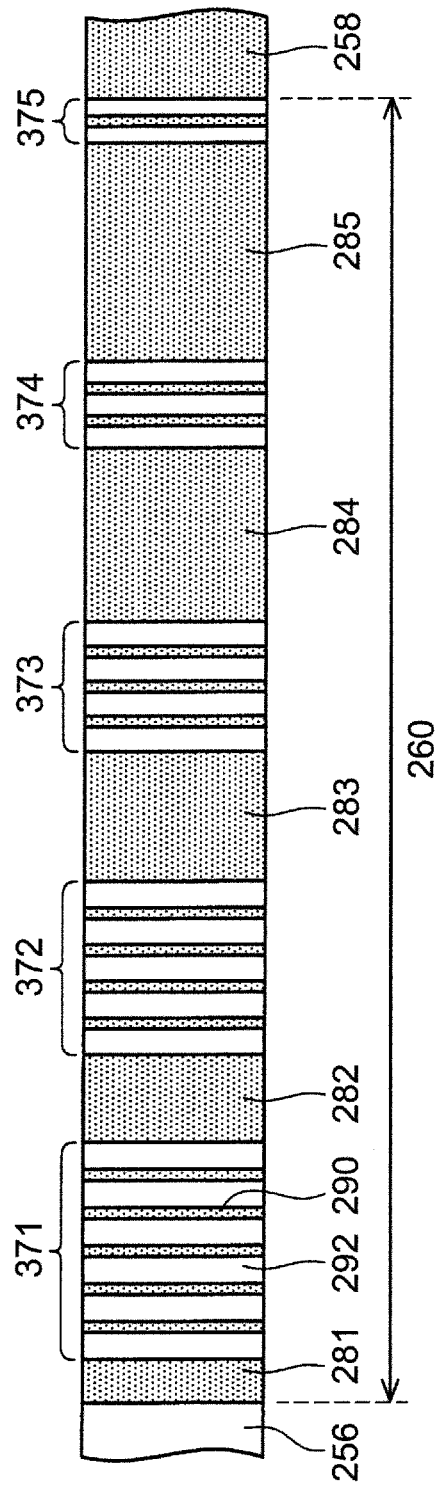
FIG. 11 is an enlarged cross-sectional view of the outer peripheral back surface pn repetitive region 260 of a variation of the second embodiment.

As shown in FIG. 11, the outer peripheral back surface pn repetitive region 260 may be formed in the semiconductor device 200 of the the second embodiment described above. In FIG. 11, by considering visibility of the drawing, the n-type regions are shown by hatching. In FIG. 11, the n-type regions 281 to 285 are formed in the same manner as in FIG. 9. On the other hand, the regions 371 to 375 between the respective n-type regions 281 to 285 are constituted of very thin n-type regions 290 and a plurality of the p-type regions 292 divided by the n-type regions 290. In this case, while widths of the respective p-type regions 292 are substantially constant, widths of the regions 371 to 375 become narrower toward the outer peripheral back surface n-type region 258. That is, the number of the p-type regions 292 contained in the regions 371 to 375 becomes scarce to the outer peripheral back surface n-type region 258 side. Also in the configuration like this, a substantially same effect as the configuration of FIG. 9 can be obtained. The widths of the respective n-type regions 290 may be different from each other or may be the same each other. However, the widths of the respective n-type regions 290 are preferable to be 10 μm or less. When the widths of the n-type regions 290 are set to 10 μm or less, an entirety of the respective regions 371 to 375 can behave like the p-type region since the n-type regions 290 no longer functions as a carrier implantation layer. Further, the n-type regions 281 to 285 of the semiconductor device 200 of the second embodiment may be divided by the p-type regions having small width in the same manner as the regions 371 to 375 of FIG. 11. In this case, the widths of the p-type regions having small width are preferable to be set to 10 μm or less.

Further, also according to the semiconductor device 200 of the second embodiment, the configuration can be varied in the same manner as variations of the first embodiment shown in FIGS. 5 to 8.

In the above, although specific embodiments of the present invention have been described in detail, these are only illustrations and do not limit the present invention. In the present invention, various alterations and variations of the illustrated specific embodiments are contained.

What is claimed is:

1. A semiconductor device comprising:
    a semiconductor substrate in which an IGBT and a diode are formed;
    a front surface electrode formed on a front surface of the semiconductor substrate; and
    a back surface electrode formed on a back surface of the semiconductor substrate, wherein
    an n-type emitter region of the IGBT, a p-type body region of the IGBT, and a p-type anode region of the diode are formed in a range exposed on the front surface in the semiconductor substrate,
    the n-type emitter region is connected with the front surface electrode,
    the p-type body region is connected with the front surface electrode,
    the p-type anode region is connected with the front surface electrode,
    a p-type collector region of the IGBT, and an n-type cathode region of the diode are formed in a range exposed on the back surface in the semiconductor substrate,
    the p-type collector region is connected with the back surface electrode,
    the n-type cathode region is connected with the back surface electrode,
    a contact outer peripheral edge p-type region that is connected with the front surface electrode is formed in a range that contains an outer peripheral edge of a contact region of the front surface in the semiconductor substrate, the contact region being in contact with the front surface electrode,
    an outer peripheral back surface p-type region, an outer peripheral back surface n-type region, and an outer peripheral low concentration n-type region are formed in an outer peripheral region of the semiconductor substrate,
    the outer peripheral region is located between the outer peripheral edge and an end surface of the semiconductor substrate,
    the outer peripheral back surface p-type region is formed in a first range exposed on the back surface,
    when the semiconductor substrate is viewed in a plan view in a thickness direction, the outer peripheral edge is located in the first range,
    the outer peripheral back surface p-type region is connected with the back surface electrode,
    the outer peripheral back surface n-type region is formed in a second range that is located on a side of the end surface with respect to the outer peripheral back surface p-type region and exposed on the back surface,
    the outer peripheral back surface n-type region is in contact with the outer peripheral back surface p-type region,
    the outer peripheral back surface n-type region is connected with the back surface electrode,
    the outer peripheral low concentration n-type region has an n-type impurity concentration lower than an n-type impurity concentration of the outer peripheral back surface n-type region,
    the outer peripheral low concentration n-type region separates the outer peripheral back surface p-type region and the outer peripheral back surface n-type region from the contact outer peripheral edge p-type region,
    a p-type impurity concentration in the outer peripheral back surface p-type region decreases toward the end surface, and
    the n-type impurity concentration in the outer peripheral back surface n-type region increases toward the end surface.

2. The semiconductor device according to claim 1, wherein
    when the semiconductor substrate is viewed in a plan view in a thickness direction, a p-type impurity concentration in a boundary of the outer peripheral back surface p-type region and the outer peripheral back surface n-type region in a first region is lower than a p-type impurity concentration in the boundary in a second region,
    when the semiconductor substrate is viewed in a plan view in a thickness direction, the first region is located between a corner part of the end surface and a corner part of the outer peripheral edge, and
    when the semiconductor substrate is viewed in a plan view in a thickness direction, the second region is located between a straight line part of the end surface and the straight line part of the outer peripheral edge.

3. A semiconductor device comprising:
    a semiconductor substrate in which an IGBT and a diode are formed;
    a front surface electrode formed on a front surface of the semiconductor substrate; and
    a back surface electrode formed on a back surface of the semiconductor substrate, wherein
    an n-type emitter region of the IGBT, a p-type body region of the IGBT, and a p-type anode region of the diode are formed in a range exposed on the front surface in the semiconductor substrate, the n-type emitter region is connected with the front surface electrode, the p-type body region is connected with the front surface electrode, the p-type anode region is connected with the front surface electrode, a p-type collector region of the IGBT, and an n-type cathode region of the diode are formed in a range exposed on the back surface in the semiconductor substrate, the p-type collector region is connected with the back surface electrode, the n-type cathode region is connected with the back surface electrode, a contact outer peripheral edge p-type region that is connected with the front surface electrode is formed in a range that contains an outer peripheral edge of a contact region of the front surface in the semiconductor substrate, the contact region being in contact with the front surface electrode, an outer peripheral back surface p-type region, an outer peripheral back surface n-type region, an outer peripheral back surface pn repetitive region, and an outer peripheral low concentration n-type region are formed in an outer peripheral region of the semiconductor substrate, the outer peripheral region is located between the outer peripheral edge and an end surface of the semiconductor substrate, the outer peripheral back surface p-type region is formed in a first range exposed on the back surface, when the semiconductor substrate is viewed in a plan view in a thickness direction, the outer peripheral edge is located in the first range, the outer peripheral back surface p-type region is connected with the back surface electrode, the outer peripheral back surface n-type region is formed in a second range that is located on a side of the end surface with respect to the outer peripheral back surface p-type region and exposed on the back surface, the outer peripheral back surface n-type region is connected with the back surface electrode, the outer peripheral back surface pn repetitive region is formed in a third range that is located between the outer peripheral back surface p-type region and the outer peripheral back surface n-type region and exposed on the back surface, the outer peripheral back surface pn repetitive region is connected with the back surface electrode, p-type regions and n-type regions are alternately and repeatedly formed in the outer peripheral back surface pn repetitive region in a direction from the outer peripheral back surface p-type region toward the outer peripheral back surface n-type region, the outer peripheral low concentration n-type region has an n-type impurity concentration lower than an n-type impurity concentration of the respective n-type regions and the outer peripheral back surface n-type region in the outer peripheral back surface pn repetitive region, the outer peripheral low concentration n-type region separates the outer peripheral back surface p-type region, the outer peripheral back surface n-type region and the outer peripheral pn repetitive region from the contact outer peripheral edge p-type region, and when the semiconductor substrate is viewed in a plan view in a thickness direction, an area ratio of the p-type regions to the n-type regions in the outer peripheral back surface pn repetitive region is higher in a range on a side of the outer peripheral back surface p-type region with respect to a center of the outer peripheral back surface pn repetitive region than in a range on a side of the outer peripheral back surface n-type region with respect to the center of the outer peripheral back surface pn repetitive region.

4. The semiconductor device according to claim 3, wherein the closer to the outer peripheral back surface p-type region each of the p-type regions in the outer peripheral back surface pn repetitive region is, the broader widths the each of the p-type regions has in the direction from the outer peripheral back surface p-type region toward the outer peripheral back surface n-type region, and the closer to the outer peripheral back surface n-type region each of the n-type regions in the outer peripheral back surface pn repetitive region is, the broader widths the each of the n-type regions has in the direction from the outer peripheral back surface p-type region toward the outer peripheral back surface n-type region.

5. The semiconductor device according to claim 4, wherein the each of the p-type regions in the outer peripheral back surface pn repetitive region is separated by at least one n-type region in the direction from the outer peripheral back surface p-type region toward the outer peripheral back surface n-type region.

6. The semiconductor device according to claim 3, wherein when the semiconductor substrate is viewed in a plan view in a thickness direction, the outer peripheral back surface pn repetitive region is formed so as to surround the contact region.

* * * * *